US012757506B2

(12) United States Patent
Cho

(10) Patent No.: US 12,757,506 B2
(45) Date of Patent: Oct. 6, 2026

(54) IMAGE SENSOR PACKAGE INCLUDING A CHIP STACK STRUCTURE

(71) Applicant: SAMSUNG ELECTRONICS CO., LTD., Suwon-si (KR)

(72) Inventor: Kyongsoon Cho, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 526 days.

(21) Appl. No.: 18/338,933

(22) Filed: Jun. 21, 2023

(65) Prior Publication Data

US 2024/0006434 A1 Jan. 4, 2024

(30) Foreign Application Priority Data

Jul. 1, 2022 (KR) ........................ 10-2022-0081498

(51) Int. Cl.

| | |
|---|---|
| ***H10F 39/00*** | (2025.01) |
| ***H10W 74/10*** | (2026.01) |
| ***H10W 90/00*** | (2026.01) |
| *H10W 72/00* | (2026.01) |
| *H10W 72/20* | (2026.01) |

(52) U.S. Cl.

CPC ......... *H10F 39/804* (2025.01); *H10F 39/811* (2025.01); *H10W 74/117* (2026.01); *H10W 90/00* (2026.01); *H10W 72/07254* (2026.01); *H10W 72/247* (2026.01); *H10W 72/859* (2026.01); *H10W 90/722* (2026.01); *H10W 90/724* (2026.01); *H10W 90/754* (2026.01)

(58) Field of Classification Search

CPC .. H10F 39/804; H10F 39/811; H10W 74/117; H10W 90/00

See application file for complete search history.

(56) References Cited

U.S. PATENT DOCUMENTS

| | | | | |
|---|---|---|---|---|
| 7,153,720 B2 | 12/2006 | Augusto | | |
| 7,291,926 B2 * | 11/2007 | Tao | .......................... H01L 25/03 | 257/E23.177 |
| 7,361,989 B1 | 4/2008 | Adkisson et al. | | |

(Continued)

FOREIGN PATENT DOCUMENTS

| | | |
|---|---|---|
| KR | 10-2006-0077170 A | 7/2006 |
| KR | 10-2012-0110451 A | 10/2012 |

(Continued)

OTHER PUBLICATIONS

Office Action mailed Dec. 19, 2025 in corresponding Korean Patent Application No. 10-2022-0081498.

*Primary Examiner* — Eugene Lee

(74) *Attorney, Agent, or Firm* — Morgan, Lewis & Bockius LLP

(57) ABSTRACT

An image sensor package includes a package substrate, a logic chip mounted on the package substrate and having a central region and an edge region, an image sensor chip mounted on the central region of the logic chip, a bonding wire electrically interconnecting the package substrate to the logic chip and bonded to the edge region of the logic chip, a dam structure disposed in the edge region of the logic chip to cover a portion of the bonding wire, a cover glass disposed on the dam structure, and an encapsulation structure encapsulating the bonding wire on the package substrate.

10 Claims, 15 Drawing Sheets

(56) References Cited

U.S. PATENT DOCUMENTS

| | | | | |
|---|---|---|---|---|
| 7,443,037 | B2 * | 10/2008 | Kim | H01L 25/0657 257/E27.137 |
| 9,159,852 | B2 | 10/2015 | Huang et al. | |
| 9,337,228 | B2 | 5/2016 | Sa et al. | |
| 9,426,376 | B2 | 8/2016 | Ueki et al. | |
| 9,502,455 | B2 | 11/2016 | Akahoshi | |
| 9,697,409 | B2 | 7/2017 | Myers | |
| 10,007,833 | B2 | 6/2018 | Pope et al. | |
| 10,164,133 | B2 | 12/2018 | Huang et al. | |
| 10,510,737 | B2 | 12/2019 | Kim et al. | |
| 10,651,224 | B2 | 5/2020 | Kim et al. | |
| 11,329,083 | B2 | 5/2022 | Wu et al. | |
| 2004/0189854 | A1 * | 9/2004 | Tsukamoto | G02B 7/02 348/340 |
| 2007/0152345 | A1 * | 7/2007 | Wu | H01L 25/0657 257/777 |
| 2009/0140125 | A1 * | 6/2009 | Takayama | H10F 39/804 250/214 R |
| 2009/0166784 | A1 * | 7/2009 | Honda | H10F 39/806 257/432 |
| 2009/0267170 | A1 * | 10/2009 | Chien | H10F 39/804 257/434 |
| 2015/0255500 | A1 * | 9/2015 | Akahoshi | H10F 39/811 257/434 |
| 2019/0019834 | A1 * | 1/2019 | Tu | H10F 39/811 |
| 2019/0057952 | A1 * | 2/2019 | Chen | H01L 24/85 |
| 2020/0161351 | A1 * | 5/2020 | Tan | H10F 39/811 |
| 2020/0373341 | A1 | 11/2020 | Jo et al. | |
| 2022/0093567 | A1 | 3/2022 | Kim et al. | |
| 2022/0093664 | A1 * | 3/2022 | Punzalan | H10F 39/804 |
| 2023/0238411 | A1 * | 7/2023 | Lee | H10F 39/804 257/432 |

FOREIGN PATENT DOCUMENTS

| | | |
|---|---|---|
| KR | 10-1334213 | 11/2013 |
| KR | 10-2020-0035824 | 4/2020 |
| KR | 10-2022-0047030 A | 4/2022 |

* cited by examiner

IMAGE SENSOR PACKAGE INCLUDING A CHIP STACK STRUCTURE

CROSS-REFERENCE TO RELATED APPLICATION

This application claims priority under 35 U.S.C. § 119 to Korean Patent Application No. 10-2022-0081498, filed on Jul. 1, 2022, in the Korean Intellectual Property Office, the disclosure of which is incorporated by reference herein in its entirety.

TECHNICAL FIELD

The inventive concept relates to an image sensor package, and more particularly, to an image sensor package including a chip stack structure.

DISCUSSION OF THE RELATED ART

An image sensor for picking up images of an object and convert them into electrical signals is widely used, not only in a consumer electronic device like a digital camera, a mobile phone camera, and a portable camcorder, but also in a camera mounted on an automobile, a security device, and a robot. Due to the rapid developments of the electronics industry and demands of users, electronic devices are becoming smaller and lighter and so too are packages including image sensors.

SUMMARY

An image sensor package includes a package substrate. A logic chip is mounted on the package substrate and has a central region and an edge region. An image sensor chip is mounted on the central region of the logic chip. A bonding wire electrically interconnects the package substrate to the logic chip and is bonded to the edge region of the logic chip. A dam structure is disposed in the edge region of the logic chip and covers a portion of the bonding wire. A cover glass is disposed on the dam structure. An encapsulation structure encapsulates the bonding wire on the package substrate.

An image sensor package includes a logic chip having a central region and an edge region. An image sensor chip is mounted on the central region of the logic chip. A solder ball is disposed between the logic chip and the image sensor chip. A dam structure is disposed in the edge region of the logic chip. A cover glass is disposed on the dam structure. The image sensor chip is electrically connected to a through silicon via inside the logic chip through the solder ball.

An image sensor package includes a package substrate having a chip mounting space therein. A logic chip is mounted in the chip mounting space of the package substrate and has a central region and an edge region. An image sensor chip is disposed in the chip mounting space of the package substrate and is mounted on the central region of the logic chip. A cover glass is disposed on the package substrate and covers the image sensor chip.

BRIEF DESCRIPTION OF THE DRAWINGS

Embodiments of the inventive concept will be more clearly understood from the following detailed description taken in conjunction with the accompanying drawings in which.

DETAILED DESCRIPTION OF THE EMBODIMENTS

Figure 1:
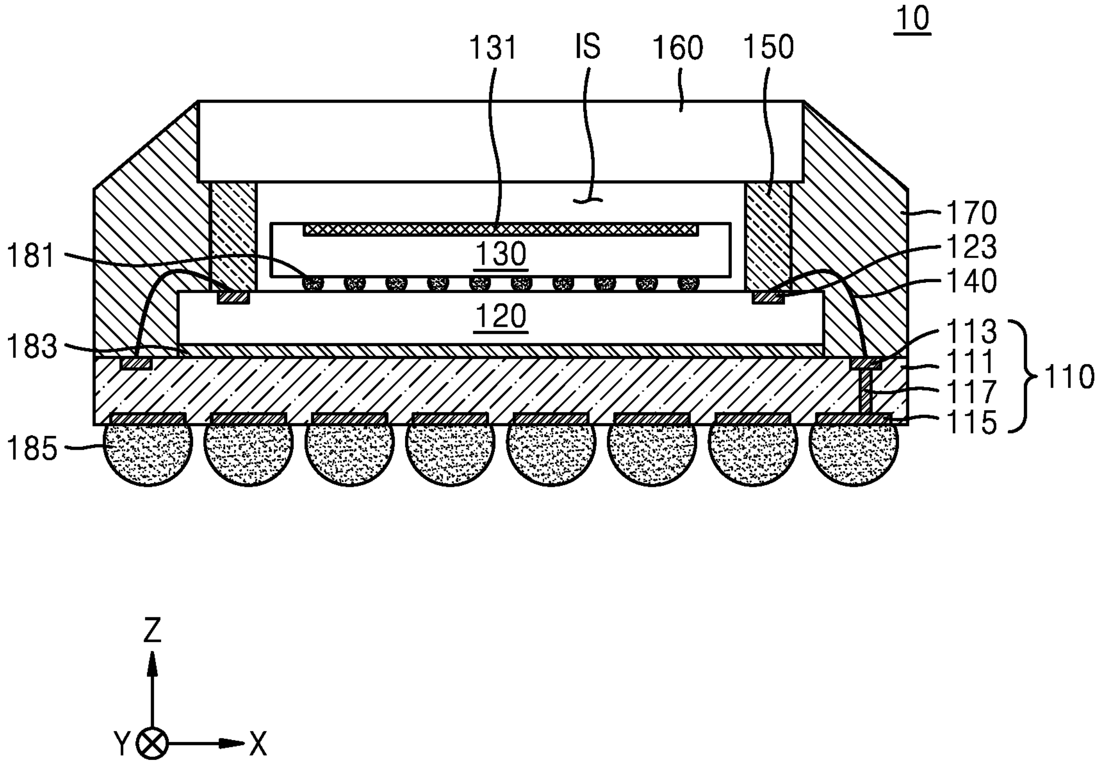
FIG. 1 is a cross-sectional view of an image sensor package according to an embodiment.
Figure 2:
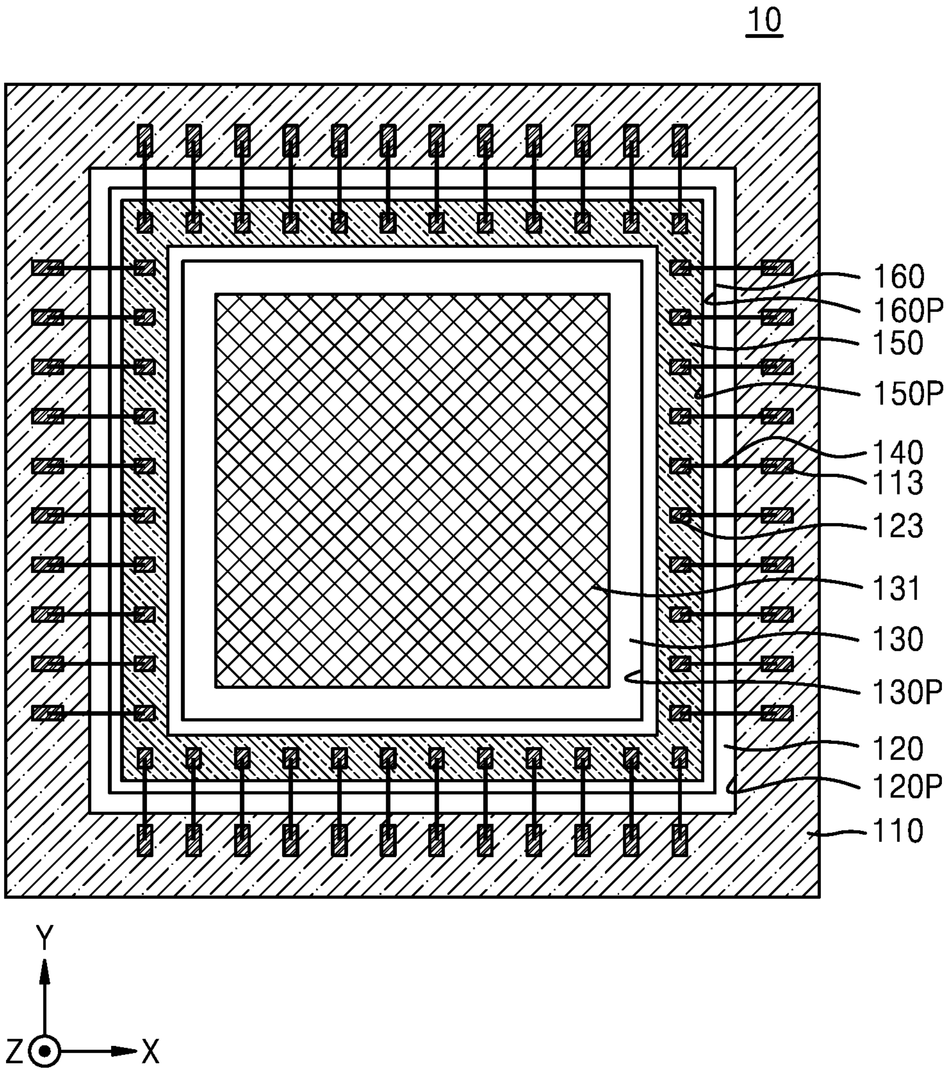
FIG. 2 is a plan view of an image sensor package according to an embodiment.

FIG. 1 is a cross-sectional view of an image sensor package according to an embodiment, and FIG. 2 is a plan view of the image sensor package of FIG. 1. For convenience of explanation, FIG. 2 shows a state in which an encapsulation structure is removed from the image sensor package of FIG. 1.

Referring to FIGS. 1 and 2 together, an image sensor package 10 may include a package substrate 110, a logic chip 120, an image sensor chip 130, a bonding wire 140, a dam structure 150, a cover glass 160, and an encapsulation structure 170.

The package substrate 110 may be, for example, a printed circuit board (PCB). The package substrate 110 may include a substrate base 111 including at least one selected from among a phenol resin, an epoxy resin, and polyimide. Also, the package substrate 110 may include an upper substrate pad 113 disposed on the top surface of the substrate base 111 and a lower substrate pad 115 disposed on the bottom surface of the substrate base 111. An internal wiring pattern 117 for electrically connecting the upper substrate pad 113 to the lower substrate pad 115 may be disposed in the substrate base 111. The package substrate 110 may further include an upper passivation layer that covers the top surface of the substrate base 111 and exposes the upper substrate pad 113 and a lower passivation layer that covers the bottom surface of the substrate base 111 and exposes the lower substrate pad 115.

For example, the upper substrate pad 113 and the lower substrate pad 115 may each include a metal, for example, copper (Cu), aluminum (Al), tungsten (W), titanium (Ti), tantalum (Ta), indium (In), Molybdenum (Mo), manganese (Mn), cobalt (Co), tin (Sn), nickel (Ni), magnesium (Mg), rhenium (Re), beryllium (Be), gallium (Ga), and ruthenium (Ru), or a combination thereof.

The upper substrate pad 113 may be a portion contacted by a conductive connector for electrically connecting the package substrate 110 to the logic chip 120. For example, the bonding wire 140 may extend between the upper substrate pad 113 of the package substrate 110 and a connection pad 123 of the logic chip 120 and electrically interconnect the connection pad 123 of the logic chip 120 to the upper substrate pad 113 of the package substrate 110.

The lower substrate pad 115 may be a portion to which an external connection terminal 185 is attached. The external connection terminal 185 may be connected to the lower substrate pad 115 through an opening of the lower passivation layer. The external connection terminal 185 may include, for example, a solder ball. The external connection terminal 185 may electrically interconnect the image sensor package 10 to an external device.

The logic chip 120 may be mounted on the package substrate 110. For example, the logic chip 120 may include a microprocessor, a graphics processor, a signal processor, a network processor, a chipset, an audio codec, a video codec, an application processor, etc. The logic chip 120 may have a top surface and a bottom surface that face each other. Also, the top surface of the logic chip 120 may be divided into a central region and an edge region surrounding the central region. The logic chip 120 may be attached to the top surface of the package substrate 110 through, for example, a chip adhesive 183 disposed on the bottom surface of the logic chip 120. The chip adhesive 183 may include, for example, a die attach film.

The image sensor chip 130 may be mounted on a central region of the logic chip 120. For example, the image sensor chip 130 may include a CMOS image sensor (CIS) or a charge-coupled device (CCD). The image sensor chip 130 may include a top surface and a bottom surface that face each other. For example, the image sensor chip 130 may be attached to the top surface of the logic chip 120 through an internal connection terminal 181 disposed on the bottom surface of the image sensor chip 130. The internal connection terminal 181 may include, for example, a solder ball.

The top surface of the image sensor chip 130 may include a sensing region 131. The sensing region 131 of the image sensor chip 130 may include a pixel array including a plurality of unit pixels. The plurality of unit pixels may be arranged in a 2-dimensional array on the top surface of the image sensor chip 130. The plurality of unit pixels may constitute a passive pixel sensor or an active pixel sensor. The plurality of unit pixels may include a photodiode for sensing light, a transfer transistor for transferring charges generated by the photodiode, a floating diffusion region for storing transferred charges, a reset transistor for periodically resetting the floating diffusion region, a source follower for buffering a signal according to charges accumulated in the floating diffusion region, etc.

A plurality of color filters and a plurality of micro lenses, which are sequentially arranged on the plurality of unit pixels, may be arranged in the sensing region 131 of the image sensor chip 130. The plurality of color filters may include a red (R) filter, a blue (B) filter, and a green (G) filter. Alternatively, the plurality of color filters may include a cyan (C) filter, a yellow (Y) filter, and a magenta (M) filter. The plurality of micro lenses may focus light incident on the sensing region 131 onto the plurality of unit pixels. The plurality of unit pixels may each recognize a single color by detecting components of separated incident light.

At least one of a control signal, a power signal, and a ground signal for the operation of the logic chip 120 may be provided from an external source through the bonding wire 140. Also, a data signal of the logic chip 120 may be provided from an external source through the bonding wire 140, or a data signal of the logic chip 120 may be provided to the external source. A material constituting the bonding wire 140 may include at least one of gold (Au), silver (Ag), copper (Cu), and aluminum (Al). According to some embodiments, the bonding wire 140 may be connected to the logic chip 120 through any one of a thermo compression connection and an ultrasonic connection or through a thermo-sonic connection, which is a combination of the thermal compression connection and the ultrasonic connection.

The dam structure 150 may be disposed on an edge region of the logic chip 120. For example, the dam structure 150 may include glass attach glue. The dam structure 150 may have a rectangular ring-like shape (e.g., a rectangular frame shape) continuously extending along edges of the logic chip 120 when viewed in a plan view, e.g., from above. The dam structure 150 may be spaced apart from the image sensor chip 130 by a certain distance and disposed around the image sensor chip 130. The dam structure 150 may include an internal space IS exposing the image sensor chip 130. The area of the inner space IS of the dam structure 150 may be larger than the area of the image sensor chip 130. Inner walls of the dam structure 150 may face outer walls of the image sensor chip 130. The vertical level of the top surface of the dam structure 150 may be higher than the vertical level of the top surface of the image sensor chip 130.

Also, the dam structure 150 may completely cover the connection pad 123 and partially cover the bonding wire 140. For example, the bonding wire 140 bonded to the connection pad 123 may pass through the dam structure 150 and be connected to the upper substrate pad 113.

The cover glass 160 may be attached onto the dam structure 150 and may cover the internal space IS of the dam structure 150. The cover glass 160 may include a material having high light transmittance. For example, the cover glass 160 may include transparent glass or a transparent polymer. According to some embodiments, the cover glass 160 may further include a filter for passing or blocking light of a particular wavelength band.

An encapsulation structure 170 is disposed on the package substrate 110 and may surround the logic chip 120, the dam structure 150, and the cover glass 160. For example, the encapsulation structure 170 may cover the outer walls of the logic chip 120, outer walls of the dam structure 150, and outer walls of the cover glass 160. The encapsulation structure 170 might not cover the top surface of the cover glass 160, such that the top surface of the cover glass 160 is exposed.

For example, the encapsulation structure 170 may be formed by injecting an insulating resin onto the package substrate 110 and curing the insulating resin. While the encapsulation structure 170 is being formed, the dam structure 150 may block the material constituting the encapsulation structure 170 from flowing into the internal space IS of the dam structure 150 to prevent the material constituting the encapsulation structure 170 from contacting the image sensor chip 130, thereby preventing the encapsulation structure 170 from being filled between the sensing region 131 and the cover glass 160. The encapsulation structure 170 may include an epoxy-based molding resin, a polyimide-based molding resin, etc. For example, the encapsulation structure 170 may include an epoxy molding compound.

The encapsulation structure 170 may completely cover the bonding wire 140. Since the encapsulation structure 170 covers the package substrate 110, the horizontal width of the encapsulation structure 170 may be substantially the same as the horizontal width of the image sensor package 10.

In general, in an image sensor package, a logic chip (e.g., lower chip) and an image sensor chip (e.g., upper chip) are bonded to one another through wafer-to-wafer bonding and are cut, and thus, the upper chip and the lower chip have the same size. Recently, the size of a logic chip has been increasing to facilitate image processing. Therefore, when a logic chip and an image sensor chip are manufactured in the same size in an image sensor package, the chip die yield of a wafer including the image sensor chip deteriorates.

To resolve this problem, the image sensor package 10, according to the inventive concept, may be designed, such that components constituting the image sensor package 10 have sizes different from one another, and thus the components may be arranged in a minimum space at a maximum efficiency. For example, when all of the components are viewed in a plan view, e.g., from above, relationships between the areas of the components are as follows.

A first area 120P of the logic chip 120 may be larger than a second area 130P of the image sensor chip 130. For example, the image sensor package 10 may be manufactured by chip-to-chip bonding for mounting each image sensor chip 130 on each logic chip 120 in a chip stack structure, instead of wafer-to-wafer bonding between a first wafer including a plurality of logic chips 120 and a second wafer including a plurality of image sensor chips 130. According to the manufacturing method, the image sensor chip 130 having a smaller area than that of the logic chip 120 may be mounted on the central region of the logic chip 120.

Therefore, in the image sensor package 10, the dam structure 150 may be disposed on the edge region of the logic chip 120, on which the image sensor chip 130 is not mounted. In this case, a third area 150P defined by the dam structure 150 may be larger than the second area 130P of the image sensor chip 130. According to some embodiments, the third area 150P of the dam structure 150 may be smaller than the first area 120P of the logic chip 120. According to some other embodiments, the third area 150P of the dam structure 150 may be substantially the same as the first area 120P of the logic chip 120.

Also, to protect the sensing region 131 of the image sensor chip 130 from external contamination or impact, a fourth area 160P of the cover glass 160 may be larger than the second area 130P of the image sensor chip 130.

Ultimately, in the image sensor package 10, according to the inventive concept, by forming a chip stack structure by manufacturing the logic chip 120 and the image sensor chip 130 to have different areas, the size of the image sensor chip 130 may be efficiently reduced and the overall size of the image sensor package 10 may be minimized.

FIGS. 3 to 6 are diagrams showing an image sensor package according to an embodiment.

Most of components constituting image sensor packages 20 and 30 described below and materials constituting the components of the image sensor package 20 and 30 are substantially the same as or similar to those described in FIGS. 1 and 2 above. Therefore, for convenience of explanation, descriptions below are mainly of the differences from the image sensor package 10 described above and to the extent that an element is not described, it may be assumed to be at least similar to a corresponding element that is described elsewhere within the specification.

Figure 3:
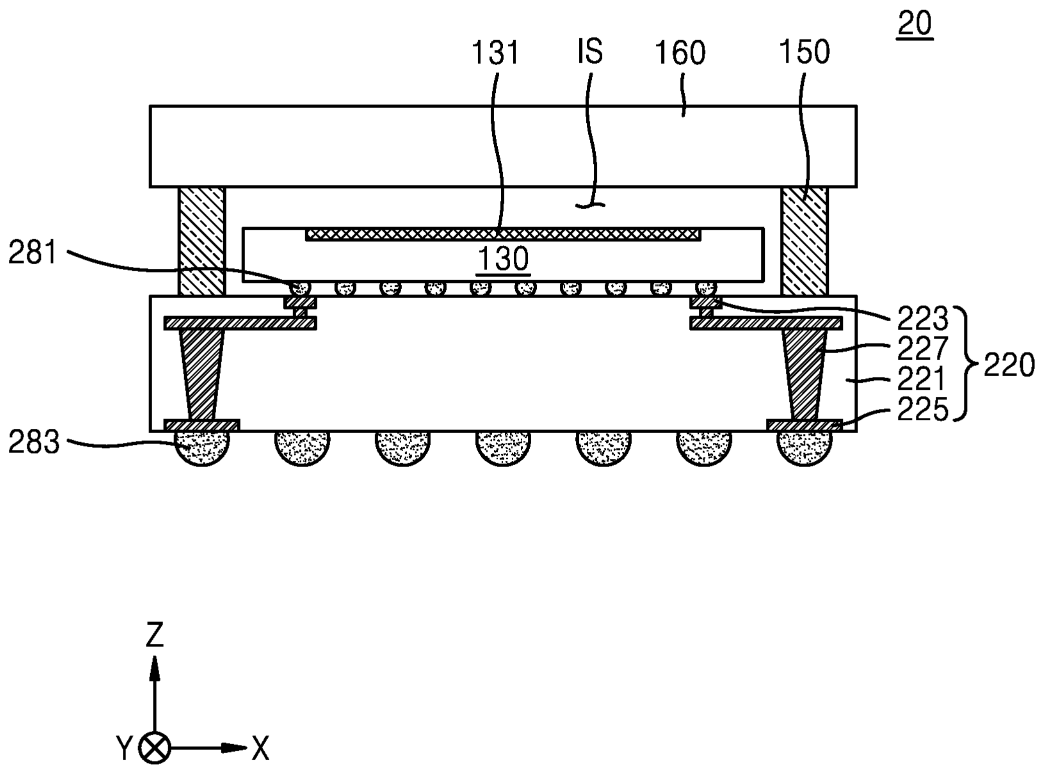
FIGS. 3 to 6 are diagrams showing an image sensor package according to an embodiment.
Figure 4:
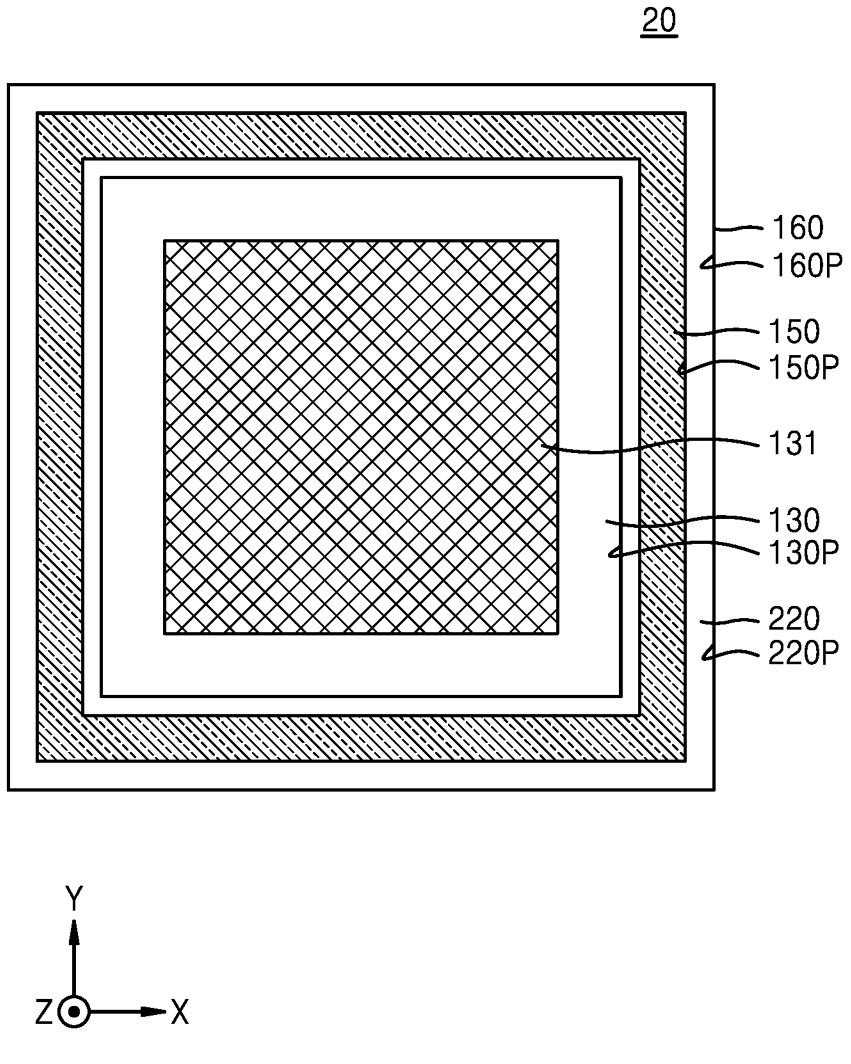

Referring to FIGS. 3 and 4 together, an image sensor package 20 may include a logic chip 220, the image sensor chip 130, the dam structure 150, and the cover glass 160.

The image sensor package 20, according to the present embodiment, may have a chip-scale package structure. The chip-scale package (or chip-size package) structure is a new package type that has been recently developed and may have an advantage in terms of the size of the package as compared to a typical plastic package structure.

The logic chip 220 may include a semiconductor wafer 221. Also, the logic chip 220 may include an upper connection pad 223 disposed on the top surface of the semiconductor wafer 221 and a lower connection pad 225 disposed on the bottom surface of the semiconductor wafer. 221. A through silicon via (TSV) 227 electrically interconnecting the upper connection pad 223 to the lower connection pad 225 may be disposed in the semiconductor wafer 221. The logic chip 220 may further include an upper redistribution layer that covers the top surface of the semiconductor wafer 221 and is electrically connected to the upper connection pad 223 and a lower redistribution layer that covers the bottom surface of the semiconductor wafer 221 and is electrically connected to the lower connection pad 225.

The upper connection pad 223 of the logic chip 220 may be a portion to which an internal connection terminal 281 is attached. For example, the image sensor chip 130 may be electrically connected and attached to the upper connection pad 223 of the logic chip 220 through the internal connection terminal 281 disposed on the bottom surface of the image sensor chip 130. The internal connection terminal 281 may include, for example, a solder ball.

The lower connection pad 225 of the logic chip 220 may be a portion to which an external connection terminal 283 is attached. The external connection terminal 283 may electrically interconnect the image sensor package 20 to an external device. The external connection terminal 283 may include, for example, a solder ball.

When the image sensor package 20, according to the present embodiment, is viewed in a plan view, e.g., from above, a first area 220P of the logic chip 220 may be larger than the second area 130P of the image sensor chip 130. Also, the third area 150P defined by the dam structure 150 may be smaller than the first area 220P of the logic chip 220 and larger than the second area 130P of the image sensor chip 130. Also, the fourth area 160P of the cover glass 160 may be larger than the second area 130P of the image sensor chip 130.

Figure 5:
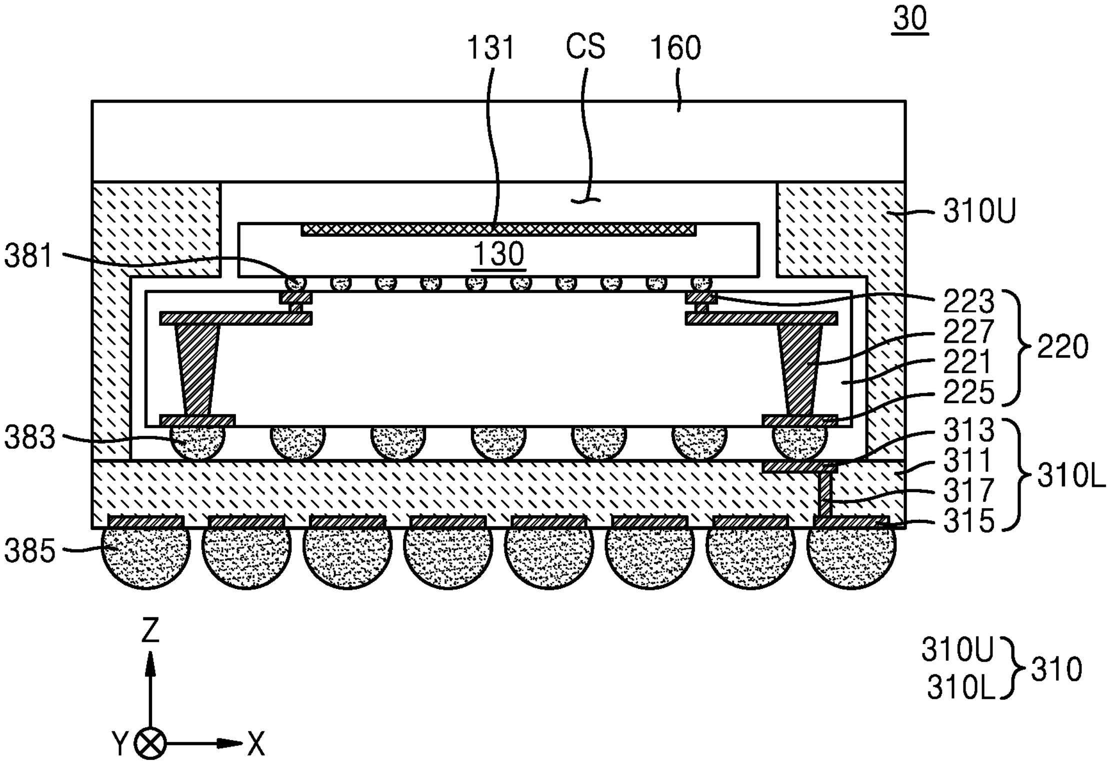
Figure 6:
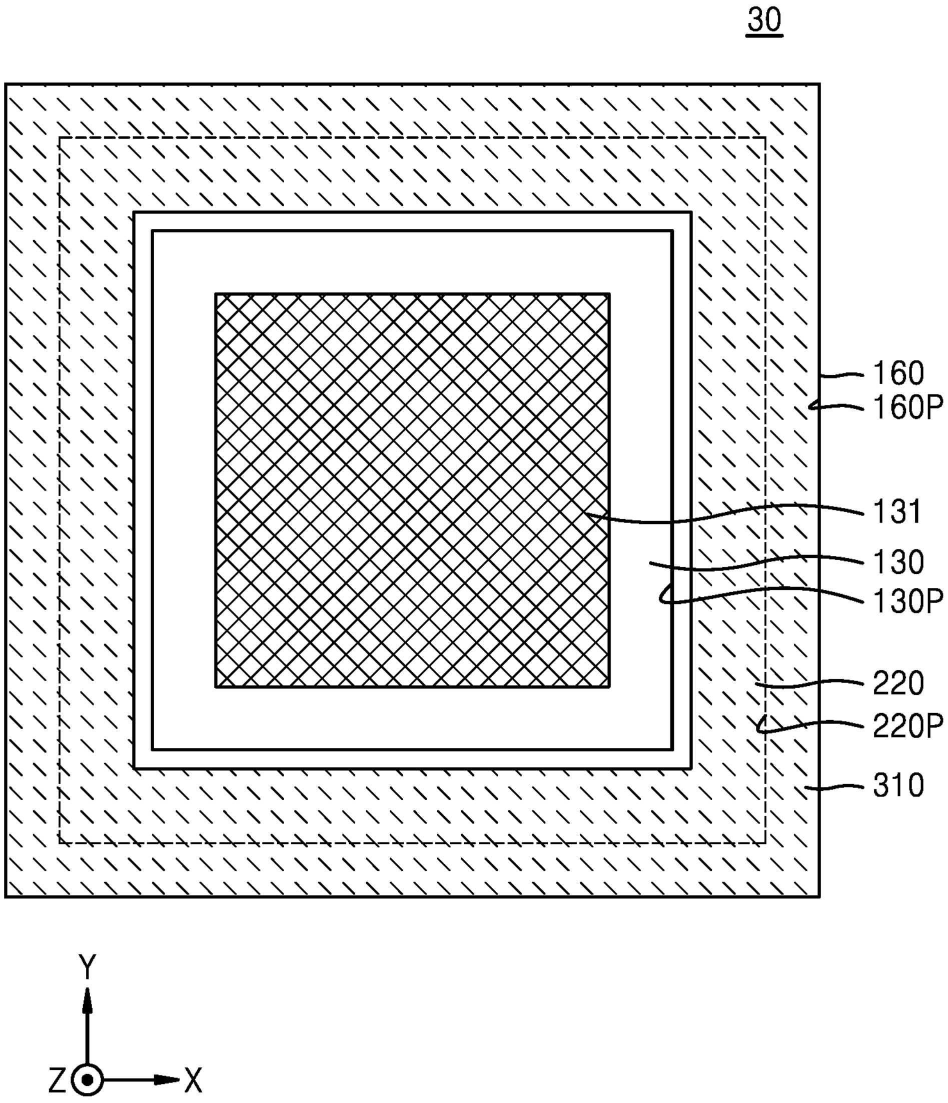

Referring to FIGS. 5 and 6 together, an image sensor package 30 may include a package substrate 310, the logic chip 220, the image sensor chip 130, and the cover glass 160.

The image sensor package 30, according to the present embodiment, may have a structure in which the logic chip 220 and the image sensor chip 130 are arranged in a chip mounting space CS inside the package substrate 310. The chip mounting space CS may have a stepped structure having a first horizontal width in a region in which the logic chip 220 is mounted and a second horizontal width, which is less than the first width, in a region in which the image sensor chip 130 is mounted.

The package substrate 310 may be a printed circuit board including a lower package substrate 310L and an upper package substrate 310U.

The lower package substrate 310L may include a substrate base 311. Also, the lower package substrate 310L may include an upper substrate pad 313 disposed on the top surface of the substrate base 311 and a lower substrate pad 315 disposed on the bottom surface of the substrate base 311. An internal wiring pattern 317 for electrically connecting the upper substrate pad 313 to the lower substrate pad 315 may be disposed in the substrate base 311.

The upper package substrate 310U may be disposed on the lower package substrate 310L and surround the logic chip 220 and the image sensor chip 130. The upper package substrate 310U may serve as an encapsulation structure that protects the logic chip 220 and the image sensor chip 130 from external contamination and impact. Also, the upper package substrate 310U may serve as a dam structure supporting the cover glass 160.

The logic chip 220 may include the semiconductor wafer 221. Also, the logic chip 220 may include the upper connection pad 223 disposed on the top surface of the semiconductor wafer 221 and the lower connection pad 225 disposed on the bottom surface of the semiconductor wafer 221. The TSV 227 electrically interconnecting the upper connection pad 223 to the lower connection pad 225 may be disposed in the semiconductor wafer 221. The logic chip 220 may further include an upper redistribution layer that covers the top surface of the semiconductor wafer 221 and is electrically connected to the upper connection pad 223 and a lower redistribution layer that covers the bottom surface of the semiconductor wafer 221 and is electrically connected to the lower connection pad 225.

The upper connection pad 223 of the logic chip 220 may be a portion to which a first connection terminal 381 is attached. For example, the image sensor chip 130 may be electrically connected and attached to the upper connection pad 223 of the logic chip 220 through the first connection terminal 381 disposed on the bottom surface of the image sensor chip 130. The first connection terminal 381 may include, for example, a solder ball.

The lower connection pad 225 of the logic chip 220 may be a portion to which a second connection terminal 383 is attached. For example, the logic chip 220 may be electrically connected and attached to the upper connection pad 313 of the package substrate 310 through the second connection terminal 383 disposed on the bottom surface of the logic chip 220. The second connection terminal 383 may include, for example, a solder ball.

The lower substrate pad 315 of the package substrate 310 may be a portion to which an external connection terminal 385 is attached. The external connection terminal 385 may electrically interconnect the image sensor package 30 to an external device. The external connection terminal 385 may include, for example, a solder ball.

When the image sensor package 30, according to the present embodiment, is viewed in a plan view, e.g., from above, the first area 220P of the logic chip 220 may be larger than the second area 130P of the image sensor chip 130. Also, the fourth area 160P of the cover glass 160 may be larger than the first area 220P of the logic chip 220 and larger than the second area 130P of the image sensor chip 130.

Figure 7:
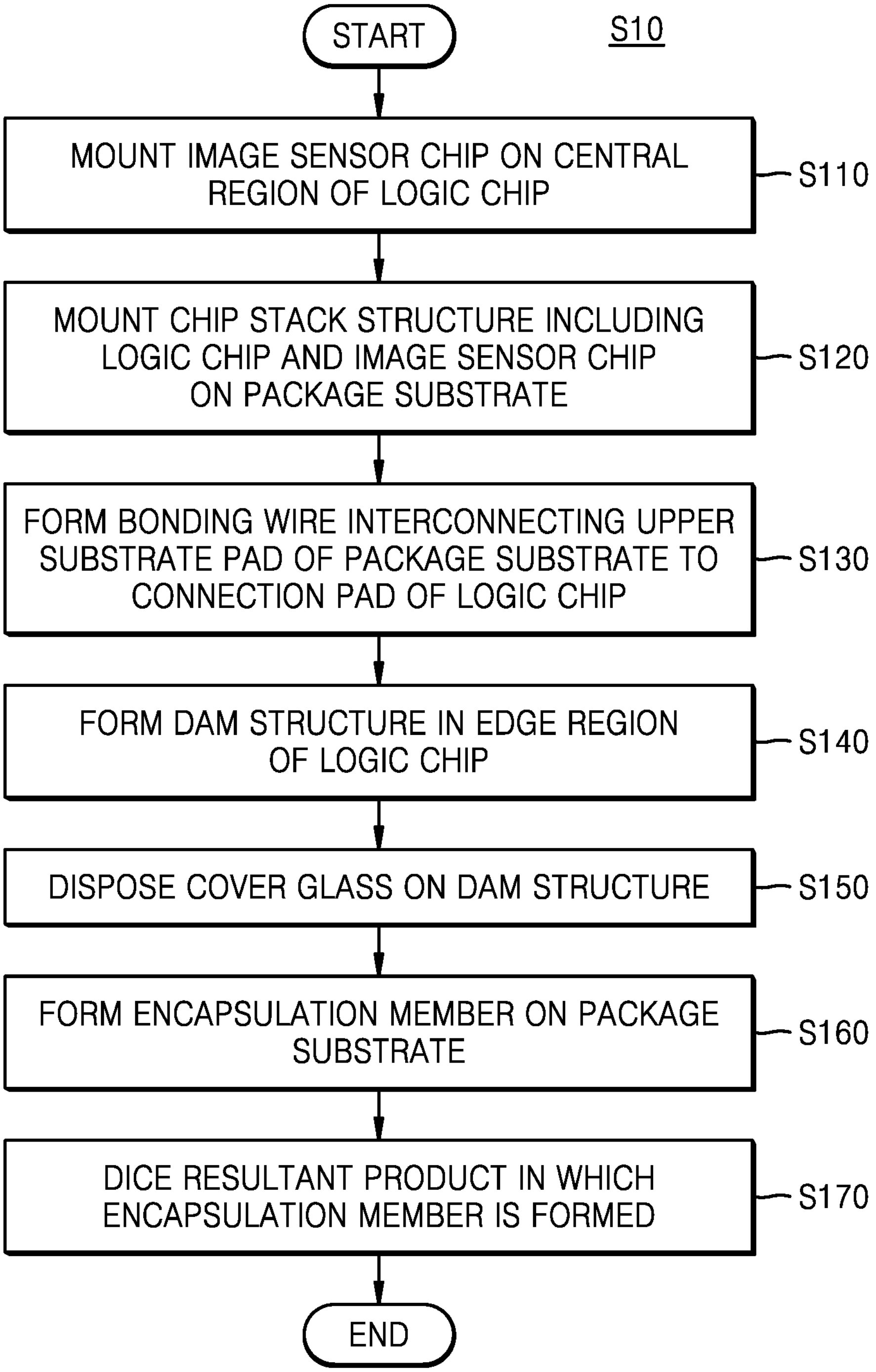
FIG. 7 is a flowchart of a method of manufacturing an image sensor package, according to an embodiment.

FIG. 7 is a flowchart of a method of manufacturing an image sensor package, according to an embodiment.

Referring to FIG. 7, a method S10 of manufacturing an image sensor package, according to the inventive concept, may include first to seventh operations S110 to S170.

In a certain embodiment that may be implemented otherwise, particular operations may be performed in an order different from that described below. For example, two successively described operations may be performed substantially and simultaneously or may be performed in an order opposite to the order described below.

The method S10 of manufacturing an image sensor package, according to the inventive concept, may include first operation S110 of mounting an image sensor chip on a central region of a logic chip, second operation S120 of mounting a chip stack structure including the logic chip and the image sensor chip on a package substrate, third operation S130 of forming a bonding wire interconnecting an upper substrate pad of the package substrate to a connection pad of the logic chip, fourth operation S140 of forming a dam structure in an edge region of the logic chip, fifth operation S150 of disposing a cover glass on the dam structure, sixth operation S160 of forming an encapsulation structure on the package substrate, and seventh operation S160 of dicing a resultant product in which the encapsulation structure is formed.

The technical features of each of first to seventh operations S110 to S170 are described below in detail with reference to FIGS. 8 to 12.

FIGS. 8 to 12 are cross-sectional views showing a method of manufacturing an image sensor package with a process sequence, according to an embodiment.

Figure 8:
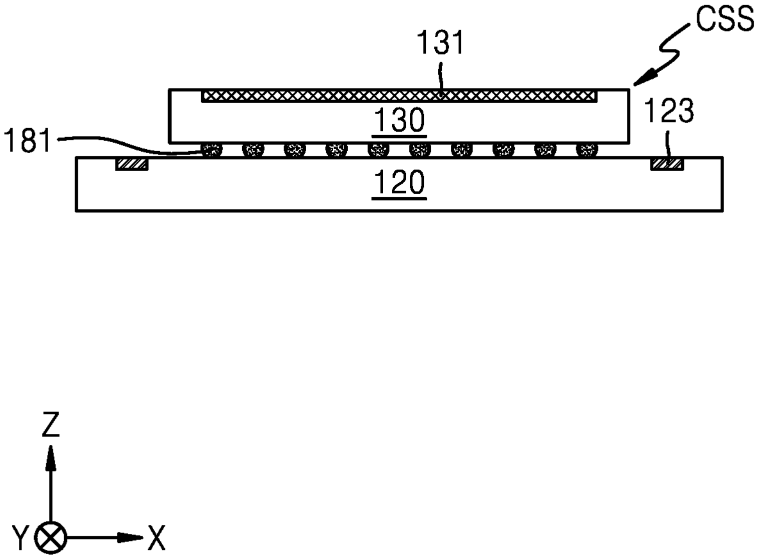
FIGS. 8 to 12 are cross-sectional views showing a method of manufacturing an image sensor package with a process sequence, according to an embodiment.

Referring to FIG. 8, the logic chip 120 is prepared, and the image sensor chip 130 may be mounted on the central region of the logic chip 120.

The image sensor chip 130 may be electrically connected and attached to the logic chip 120 through the internal connection terminal 181 disposed between the bottom surface of the image sensor chip 130 and the top surface of the logic chip 120. For example, by using a chip-to-chip bonding method of mounting each image sensor chip 130 on each logic chip 120 in a chip stack structure, a chip stack structure CSS including chips having different areas may be formed.

Figure 9:
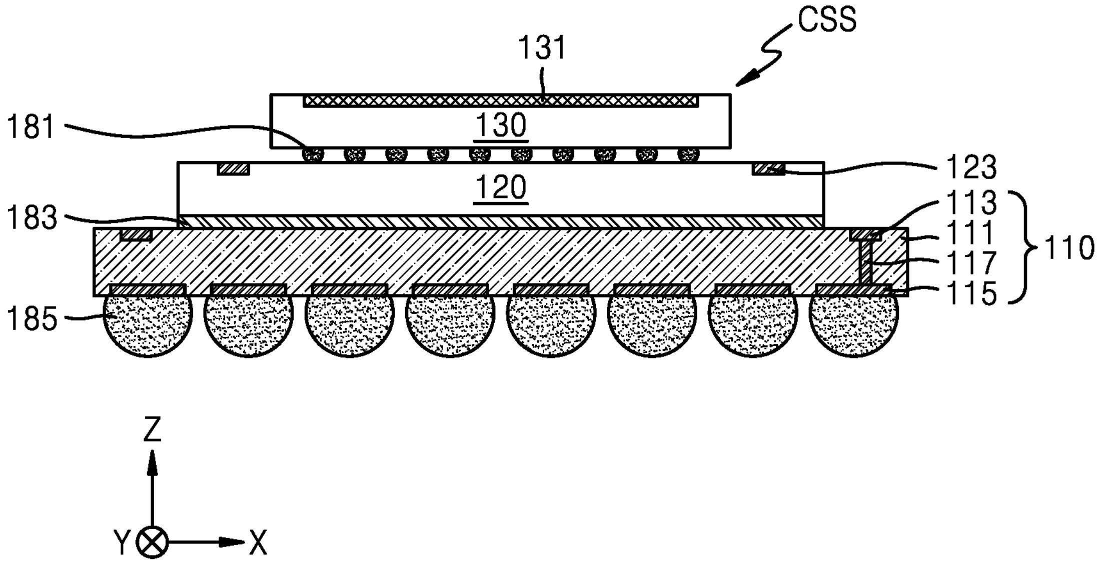

Referring to FIG. 9, the package substrate 110 is prepared, and the chip stack structure CSS may be mounted on the package substrate 110.

The logic chip 120 disposed under the chip stack structure CSS may be attached onto the package substrate 110 through the chip adhesive 183 disposed between the bottom surface of the logic chip 120 and the top surface of the package substrate 110.

The image sensor chip 130 disposed on the chip stack structure CSS may be positioned, such that the sensing region 131 included in the top surface of the image sensor chip 130 is disposed on the top of the image sensor chip 130.

Figure 10:
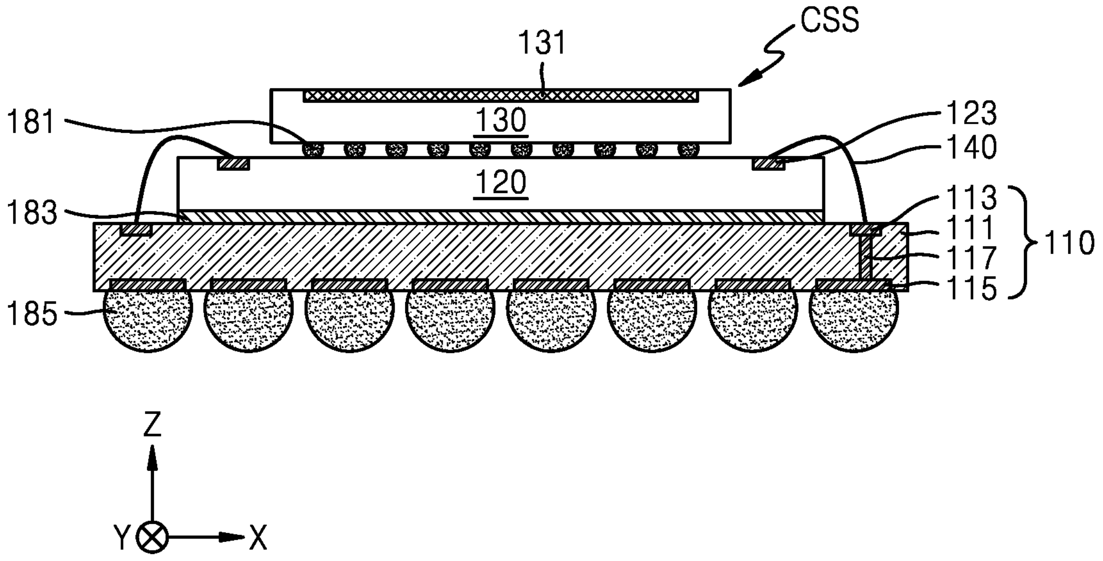

Referring to FIG. 10, the bonding wire 140 interconnecting the upper substrate pad 113 of the package substrate 110 to the connection pad 123 of the logic chip 120 may be formed.

According to some embodiments, the bonding wire 140 and the connection pad 123 of the logic chip 120 may be bonded through ball bonding, and the bonding wire 140 and the upper substrate pad 113 of the package substrate 110 may be bonded through stitch bonding.

In general, the bonding wire 140 may be formed as a loop having a curvature. In this case, the height from the top surface of the upper substrate pad 113 to the uppermost surface of the bonding wire 140 may be referred to as a loop height. Here, the loop height may be controlled, such that the level of the uppermost surface of the bonding wire 140 is lower than the level of the top surface of the image sensor chip 130.

Figure 11:
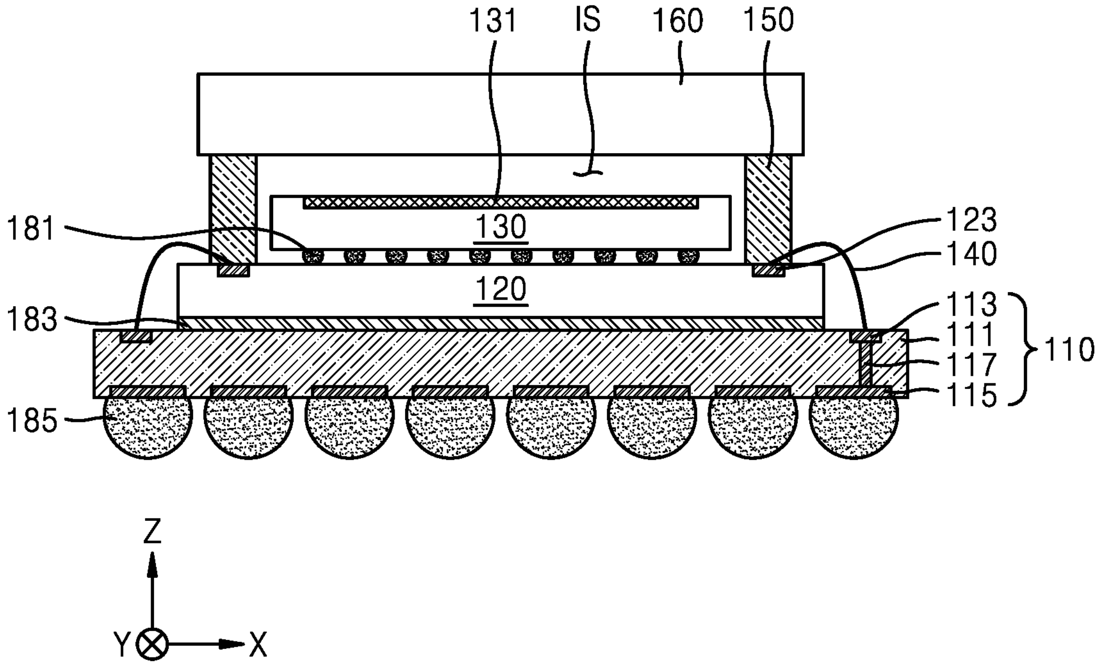

Referring to FIG. 11, the dam structure 150 may be formed on the chip stack structure CSS, and the cover glass 160 may be disposed on the dam structure 150.

In the chip stack structure CSS, the dam structure 150 may be disposed in the edge region of the logic chip 120, and the sensing region 131 of the image sensor chip 130 may be exposed through the internal space IS defined by the dam structure 150.

Here, the dam structure 150 may completely cover the connection pad 123 and partially cover the bonding wire 140. For example, the bonding wire 140 bonded to the connection pad 123 may pass through the dam structure 150 and be connected to the upper substrate pad 113.

To protect the sensing region 131 of the image sensor chip 130 from contamination and impact, the cover glass 160 may be disposed on the dam structure 150. Since the dam structure 150 may include, for example, glass attach glue, the cover glass 160 may be directly attached to the dam structure 150.

Figure 12:
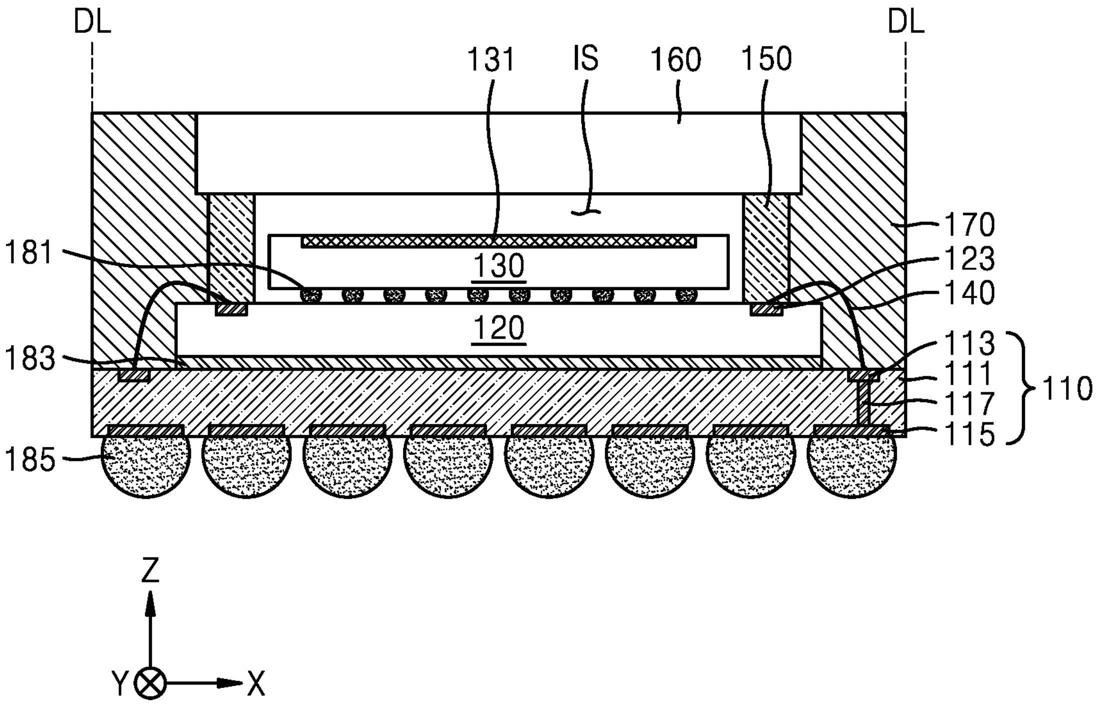

Referring to FIG. 12, the encapsulation structure 170 may be formed on the package substrate 110 and may cover the outer walls of the logic chip 120, the outer walls of the dam structure 150, and the outer walls of the cover glass 160.

To form the encapsulation structure 170, an encapsulation material may be injected onto the package substrate 110 and the encapsulation material may be cured. While the encapsulation structure 170 is being formed, the dam structure 150 and the cover glass 160 may block the encapsulation material from flowing into the internal space IS. For example, the sensing region 131 of the image sensor chip 130 might not contact the encapsulation structure 170. Also, the encapsulation structure 170 might not to cover the top surface of the cover glass 160, such that the top surface of the cover glass 160 is exposed.

Referring back to FIG. 1, after the encapsulation structure 170 is formed by curing the encapsulation material, a dicing operation may be performed on the resultant product in which the encapsulation structure 170 is formed. Through the dicing operation, the encapsulation structure 170 and the package substrate 110 are cut along a dicing line DL, and thus, the resultant product may be separated into single image sensor packages 10. According to some embodiments, the upper portion of the encapsulation structure 170 may be partially removed during the dicing operation, and thus the upper portion of the encapsulation structure 170 may have an inclined surface.

Ultimately, according to a method of manufacturing the image sensor package 10, according to the inventive concept, by forming a chip stack structure by manufacturing the logic chip 120 and the image sensor chip 130 to have different areas, the size of the image sensor chip 130 may be efficiently reduced and the total size of the image sensor package 10 may be minimized.

Figure 13:
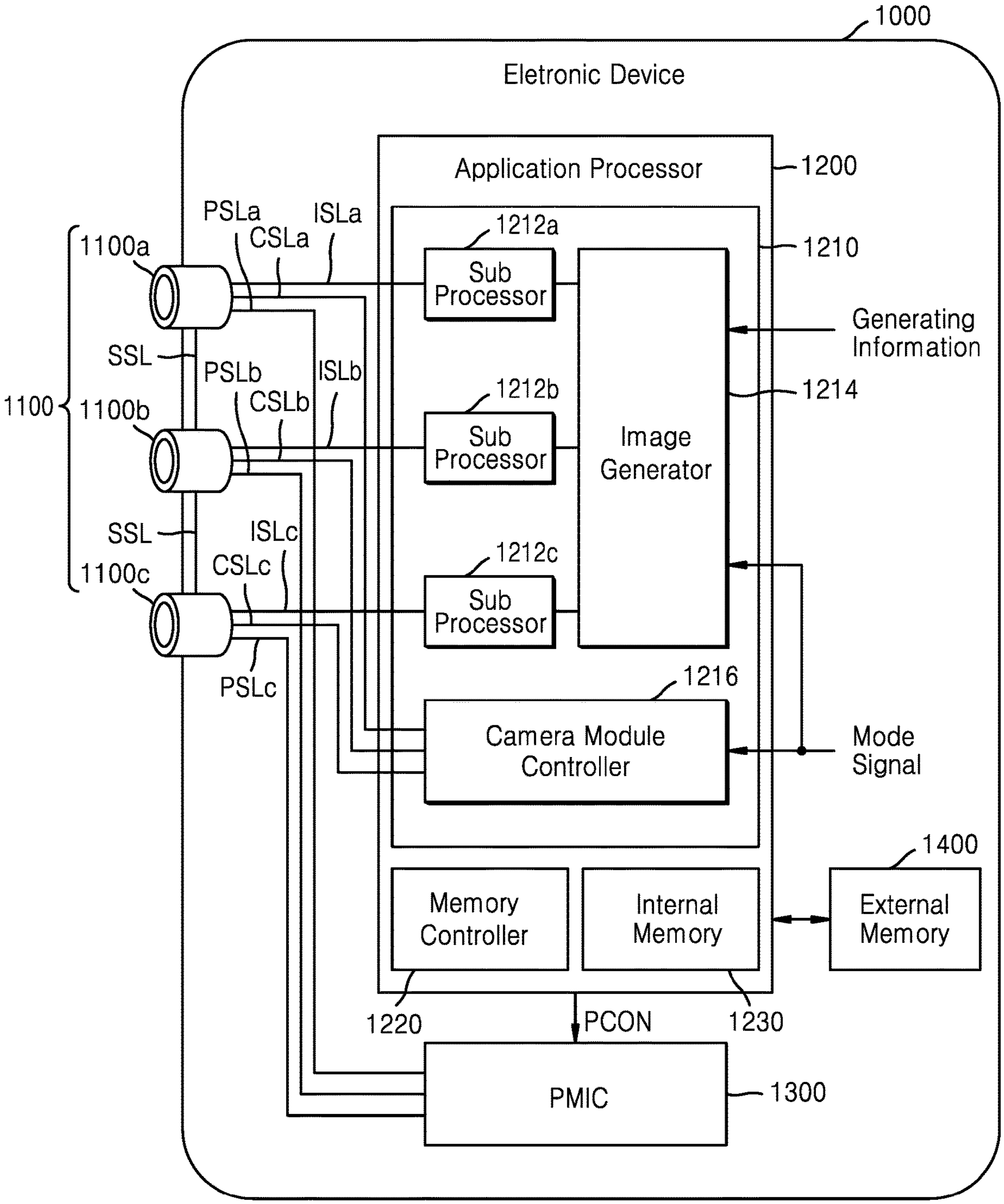
FIG. 13 is a block diagram of an electronic device including a multi-camera module.
Figure 14:
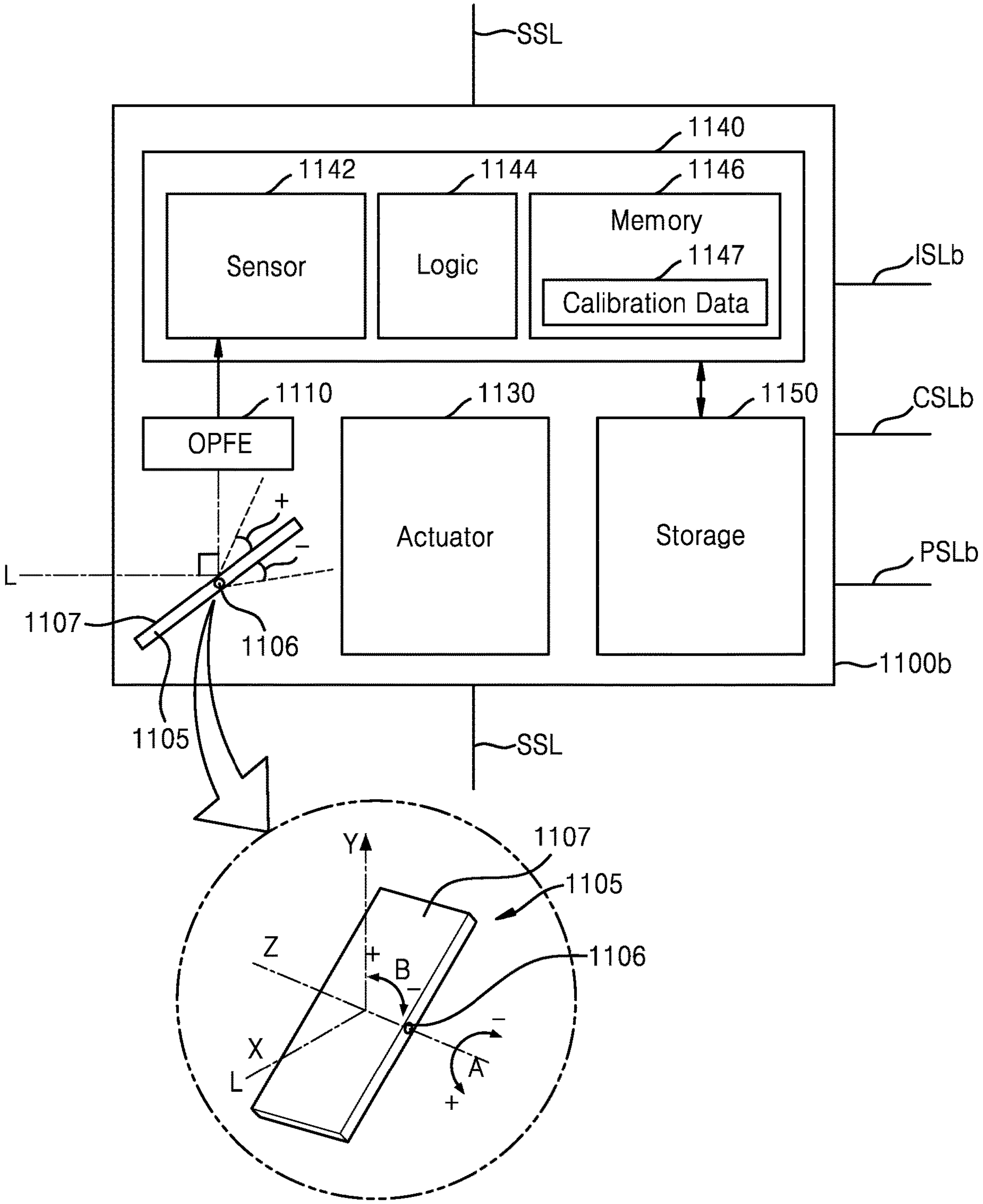
FIG. 14 is a detailed block diagram of a camera module of FIG. 13.

FIG. 13 is a block diagram of an electronic device including a multi-camera module, and FIG. 14 is a detailed block diagram of a camera module of FIG. 13.

Referring to FIG. 13, an electronic device 1000 may include a camera module group 1100, an application processor 1200, a power management integrated circuit (PMIC) 1300, and a storage 1400.

The camera module group 1100 may include a plurality of camera modules 1100*a*, 1100*b*, and 1100*c*. Although FIG. 13 shows an embodiment in which three camera modules 1100*a*, 1100*b*, and 1100*c* are arranged, embodiments are not necessarily limited thereto. According to some embodiments, the camera module group 1100 may be modified to include only two camera modules or n camera modules (where n is an integer equal to or greater than 4).

Referring to FIG. 14, the camera module 1100*b* may include a prism 1105, an optical path folding element (OPFE) 1110, an actuator 1130, an image sensing device 1140, and a storage 1150.

Here, the detailed configuration of the camera module 1100*b* will be described below in more detail, but the following description may also be applied to the other camera modules 1100*a* and 1100*c* according to embodiments.

The prism 1105 may include a reflective surface 1107 of a light reflecting material to modify the path of light L incident from an external source.

According to some embodiment, the prism 1105 may change the path of the light L incident in a first direction (e.g., X direction) to a second direction (e.g., Y direction) perpendicular to the first direction (e.g., X direction). Also, the prism 1105 may rotate the reflective surface 1107 of the light reflecting material in an A direction or a B direction around a center axis 1106, thereby changing the path of the light L incident in the first direction (e.g., X direction) to the second direction (e.g., Y direction) perpendicular to the first direction (e.g., X direction). At this time, the OPFE 1110 may also move in a third direction (e.g., Z direction) perpendicular to the first direction (e.g., X direction) and the second direction (e.g., Y direction).

According to some embodiments, as shown in FIG. 14, the maximum rotatable angle of the prism 1105 in the direction A may be less than or equal to 15 degrees in the positive (+) A direction and may be greater than 15 degrees in the negative (−) A direction. However, embodiments are not necessarily limited thereto.

According to some embodiments, the prism 1105 may be rotated by substantially 20 degrees, between 10 degrees and 20 degrees, or between 15 degrees and 20 degrees in the positive (+) or negative (−) B direction. Here, the prism 1105 may be rotated by the same angle or similar angles that are different from each other by substantially 1 degree in the positive (+) B direction and the negative (−) B direction.

According to some embodiments, the prism 1105 may move the reflective surface 1107 of the light reflecting material in the third direction (e.g., Z direction) parallel to the direction in which the center axis 1106 extends.

For example, the OPFE 1110 may include optical lenses including m (where m is a positive integer) groups. Here, m lenses may move in the second direction (e.g., Y direction) and change the optical zoom ratio of the camera module 1100*b*. For example, when the basic optical zoom ratio of the camera module 1100*b* is Z and the m optical lenses included in the OPFE 1110 move, the optical zoom ratio of the camera module 1100*b* may be changed to 3Z, 5Z, or an optical zoom ratio higher than 5Z.

The actuator 1130 may move the OPFE 1110 or optical lenses to a particular position. For example, the actuator 1130 may adjust the position of the optical lens, such that the image sensor 1142 is positioned at the focal length of the optical lens for accurate sensing.

The image sensing device 1140 may include an image sensor 1142, a control logic 1144, and a memory 1146. The image sensor 1142 may sense an image of a sensing target by using the light L provided through the optical lens. The control logic 1144 may control the overall operation of the camera module 1100*b*. For example, the control logic 1144 may control the operation of the camera module 1100*b* according to a control signal provided through a control signal line CSLb.

The memory 1146 may store information necessary for the operation of the camera module 1100*b*, e.g., calibration data 1147. The calibration data 1147 may include information necessary for the camera module 1100*b* to generate image data by using the light L provided from an external source. The calibration data 1147 may include, for example, information about a degree of rotation described above, information about a focal length, information about an optical axis, etc. When the camera module 1100*b* is implemented as a multi-state camera in which the focal length changes depending on the position of the optical lens, the calibration data 1147 may include focal distance values for respective positions (or states) of the optical lens and information related to auto focusing.

The storage 1150 may store image data sensed through the image sensor 1142. The storage 1150 may be provided outside the image sensing device 1140 and may be stacked with a sensor chip constituting the image sensing device 1140. According to some embodiments, the storage 1150 may be implemented with Electrically Erasable Programmable Read-Only Memory (EEPROM), but embodiments are not necessarily limited thereto.

Referring to FIGS. 13 and 14 together, according to some embodiments, the camera modules 1100*a*, 1100*b*, and 1100*c* may each include the actuator 1130. Therefore, the camera modules 1100*a*, 1100*b*, and 1100*c* may include the same or different calibration data 1147 according to the operation of actuators 1130 included therein.

According to some embodiments, one camera module (e.g., the camera module 1100*b*) from among the camera modules 1100*a*, 1100*b*, and 1100*c* may be a folded lens-type camera module including the prism 1105 and the OPFE 1110 as described above, and the other camera modules (e.g., 1100*a* and 1100*c*) may be a vertical-type camera module without the prism 1105 and the OPFE 1110. However, embodiments are not necessarily limited thereto.

According to some embodiments, one camera module (e.g., the camera module 1100*c*) from among the camera modules 1100*a*, 1100*b*, and 1100*c* may be a vertical-type depth camera that extracts depth information by using an infrared ray (IR), for example. In this case, the application processor 1200 may merge image data provided from such a depth camera with image data provided from another camera module (e.g., the camera module 1100*a* or 1100*b*) and generate a 3D depth image.

According to some embodiments, at least two camera modules (e.g., the camera module 1100*a* and the camera module 1100*b*) from among the camera modules 1100*a*, 1100*b*, and 1100*c* may have different field of views (FOVs). In this case, for example, at least two camera modules (e.g., the camera module 1100*a* and the camera module 1100*b*) from among the camera modules 1100*a*, 1100*b*, and 1100*c* may have different optical lenses, but the inventive concept is not necessarily limited thereto.

Furthermore, according to some embodiments, the camera modules 1100*a*, 1100*b*, and 1100*c* may have different FOVs from one another. In this case, optical lenses included in the camera modules 1100*a*, 1100*b*, and 1100*c* may also be different from one another, but the inventive concept is not necessarily limited thereto.

According to some embodiments, the camera modules 1100*a*, 1100*b*, and 1100*c* may be physically separated from one another. For example, the camera modules 1100*a*, 1100*b*, and 1100*c* do not divide and use the sensing area of one image sensor 1142. Rather, an independent image sensor 1142 may be provided inside each of the camera modules 1100*a*, 1100*b*, and 1100*c*.

Referring back to FIG. 13, the application processor 1200 may include an image processing device 1210, a memory controller 1220, and an internal memory 1230. The application processor 1200 may be implemented separately from the camera modules 1100*a*, 1100*b*, and 1100*c*. For example, the application processor 1200 and the camera modules 1100*a*, 1100*b*, and 1100*c* may be implemented separately from each other as separate semiconductor chips.

The image processing device 1210 may include a plurality of sub image processors 1212*a*, 1212*b*, and 1212*c*, an image generator 1214, and a camera module controller 1216.

The number of sub image processors (e.g., the sub image processors 1212*a*, 1212*b*, and 1212*c*) included in the image processing device 1210 may correspond to the number of a plurality of camera modules (e.g., the camera modules 1100*a*, 1100*b*, and 1100*c*).

Image data generated by the camera modules 1100*a*, 1100*b*, and 1100*c* may be respectively provided to sub image processors 1212*a*, 1212*b*, and 1212*c* respectively corresponding to the camera modules 1100*a*, 1100*b*, and 1100*c* through separate image signal lines ISLa, ISLb, and ISLc. For example, image data generated by the camera module 1100*a* may be provided to the sub image processor 1212*a* through the image signal line ISLa, image data generated by the camera module 1100*b* may be provided to the sub image processor 1212*b* through the image signal line ISLb, and image data generated by the camera module 1100*c* may be provided to the sub image processor 1212*c* through the image signal line Silks. The transmission of image data may be performed by using a camera serial interface (CSI) based on the mobile industry processor interface (MIPI), but embodiments are not necessarily limited thereto.

According to some embodiments, one sub image processor may be provided to correspond to a plurality of camera modules. For example, the sub image processor 1212*a* and the sub image processor 1212*c* may be integrally implemented as a single sub image processor instead of as separate ones, and image data provided from the camera module 1100*a* and the camera module 1100*c* may be selected by a selecting element (e.g., a MUX) and provided to the integrated sub image processor.

Image data provided to each of the sub image processors 1212*a*, 1212*b*, and 1212*c* may be provided to the image generator 1214. The image generator 1214 may generate an output image by using image data provided from each of the sub image processors 1212*a*, 1212*b*, and 1212*c* according to image generating information or a mode signal.

For example, the image generator 1214 may generate an output image by merging at least parts of image data generated by the camera modules 1100*a*, 1100*b*, and 1100*c* having different FOVs according to image generating information or a mode signal. Also, the image generator 1214 may generate an output image by selecting any one of image data generated by the camera modules 1100*a*, 1100*b*, and 1100*c* having different FOVs according to image generating information or a mode signal.

According to some embodiments, the image generating information may include a zoom signal or a zoom factor. Also, according to some embodiments, the mode signal may be, for example, a signal based on a mode selected by a user.

When the image generating information is a zoom signal (zoom factor) and the camera modules 1100*a*, 1100*b*, and 1100*c* have different FOVs, the image generator 1214 may perform different operations depending on the type of the zoom signal. For example, when the zoom signal is a first signal, after image data output from the camera module 1100*a* merges with image data output from the camera module 1100*c*, an output image may be generated by using a merged image signal and image data output from the camera module 1100*b* not used for the merging. When the zoom signal is a second signal that is different from the first signal, the image generator 1214 might not perform such image data merging and may generate an output image by selecting any one of image data output from the camera modules 1100*a*, 1100*b*, and 1100*c*. However, embodiments are not necessarily limited thereto, and a method of processing image data may be modified and implemented as needed.

According to some embodiments, the image generator 1214 may receive a plurality of pieces of image data having different exposure times from at least one of the sub image processors 1212*a*, 1212*b*, and 1212*c* and perform high dynamic range (HDR) processing on the image data, thereby generating merged image data having an increased dynamic range.

The camera module controller 1216 may provide a control signal to each of the camera modules 1100*a*, 1100*b*, and 1100*c*. A control signal generated from the camera module controller 1216 may be provided to its corresponding camera modules 1100*a*, 1100*b*, and 1100*c* through control signal lines CSLa, CSLb, and CSLc separated from one another.

Any one of the camera modules 1100*a*, 1100*b*, and 1100*c* may be designated as a master camera (e.g., 1100*b*) according to image generation information or a mode signal including a zoom signal, and the remaining camera modules (e.g., 1100*a* and 1100*c*) may be designated as slave cameras. This information is included in the control signal and may be provided to the corresponding camera modules 1100*a*, 1100*b*, and 1100*c* through the separate control signal lines CSLa, CSLb, and CSLc.

Camera modules operating as a master and slaves may be changed according to a zoom factor or an operation mode signal. For example, when the FOV of the camera module 1100*a* is wider than the FOV of the camera module 1100*b* and the zoom factor of the camera module 1100*a* indicates a lower zoom ratio, the camera module 1100*b* may operate as a master, and the camera module 1100*a* may operate as a slave. Conversely, when the zoom factor of the camera module 1100*a* indicates a higher zoom ratio, the camera module 1100*a* may operate as a master, and the camera module 1100*b* may operate as a slave.

According to some embodiment, the control signal provided to the camera modules 1100*a*, 1100*b*, and 1100*c* from the camera module controller 1216 may include a sync enable signal. For example, when the camera module 1100*b* is a master camera and the camera module 1100*a* and the camera module 1100*c* are slave cameras, the camera module controller 1216 may transmit the sync enable signal to the camera module 1100*b*. The camera module 1100*b*, to which the sync enable signal is provided, generates a sync signal based on the provided sync enable signal and provides the generated sync signal to the camera module 1100*a* and the camera module 1100*c* through a sync signal line SSL. The camera module 1100*b* and the camera modules 1100*a* and 1100*c* may be synchronized with the sync signal and transmit image data to the application processor 1200.

According to some embodiment, the control signal provided to the camera modules 1100*a*, 1100*b*, and 1100*c* from the camera module controller 1216 may include mode information according to a mode signal. Based on the mode information, the camera modules 1100*a*, 1100*b*, and 1100*c* may operate in a first operation mode and a second operation mode in relation to sensing speeds.

In a first operation mode, the camera modules 1100*a*, 1100*b*, and 1100*c* may each generate an image signal at a first speed (e.g., generate an image signal having a first frame rate), encode the image signal at a second speed that is faster than the first speed (e.g., encode to an image signal having a second frame rate higher than the first frame rate), and transmit an encoded image signal to the application processor 1200.

The application processor 1200 may store a received image signal, for example, the encoded image signal, in the internal memory 1230 provided therein or the storage 1400 outside the application processor 1200, and, thereafter, the application processor 1200 may read the encoded image signal from the internal memory 1230 or the storage 1400, decode the encoded image signal, and display image data generated based on a decoded image signal. For example, a corresponding sub image processor from among the sub image processors 1212*a*, 1212*b*, and 1212*c* of the image processing device 1210 may perform decoding and may also perform image processing on a decoded image signal.

In a second operation mode, the camera modules 1100*a*, 1100*b*, and 1100*c* may each generate an image signal at a third speed that is slower than the first speed (e.g., generate an image signal having a third frame rate lower than the first frame rate) and transmit the image signal to the application processor 1200. The image signal provided to the application processor 1200 may be an unencoded signal. The application processor 1200 may perform image processing on a received image signal or store the received image signal in the internal memory 1230 or the storage 1400.

The PMIC 1300 may supply power, e.g., a power voltage, to each of the camera modules 1100*a*, 1100*b*, and 1100*c*. For example, under control by the application processor 1200, the PMIC 1300 may supply first power to the camera module 1100*a* through a power signal line PSLa, supply second power to the camera module 1100*b* through a power signal line PSLb, and supply third power to the camera module 1100*c* through a power signal line PSLc.

The PMIC 1300 may generate power corresponding to each of the camera modules 1100*a*, 1100*b*, and 1100*c* in response to a power control signal PCON from the application processor 1200 and may also adjust power levels. The power control signal PCON may include a power adjustment signal for each operation mode of the camera modules 1100*a*, 1100*b*, and 1100*c*. For example, an operation mode may include a low-power mode, and, in this case, the power control signal PCON may include information regarding a camera module operating in the low-power mode and a power level set for the low-power mode. Levels of powers provided to the camera modules 1100*a*, 1100*b*, and 1100*c* may be the same or different from one another. Also, the level of power may be changed dynamically.

Figure 15:
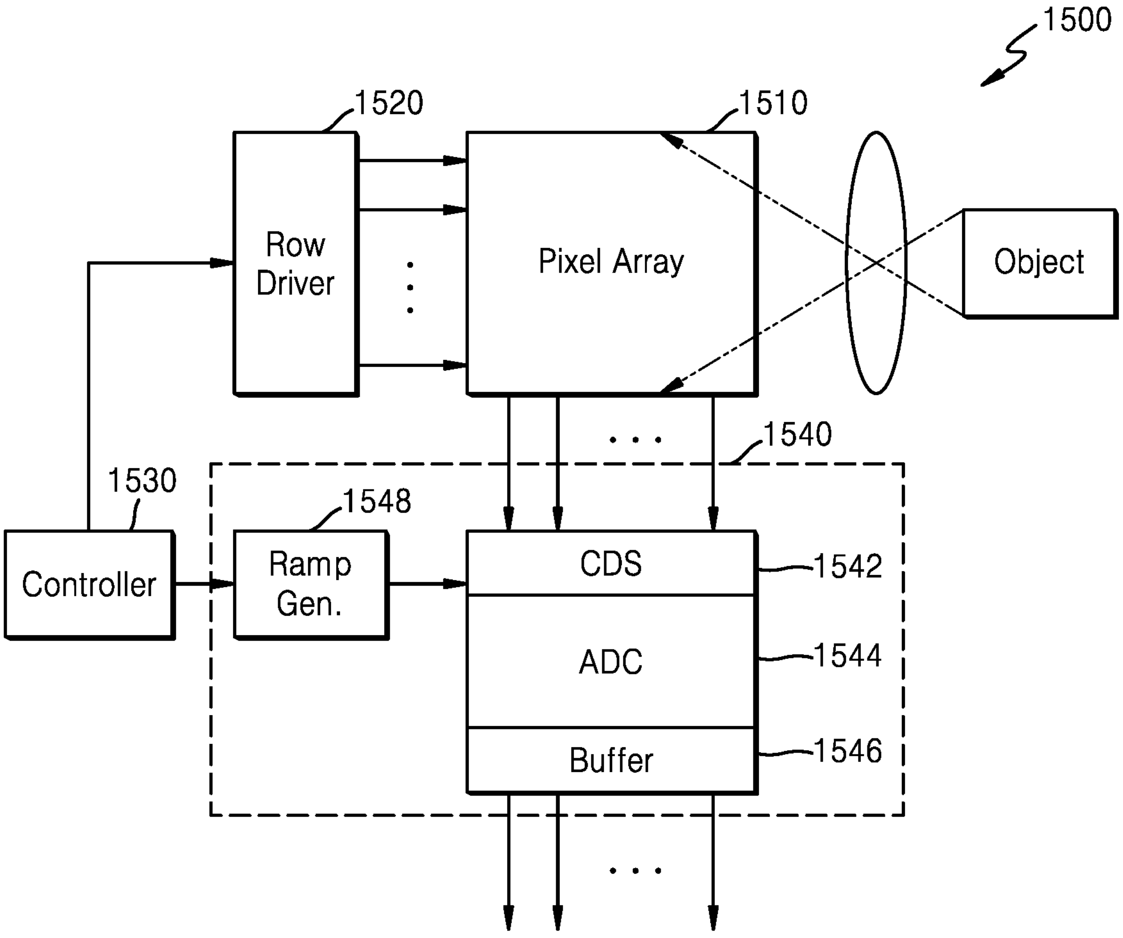
FIG. 15 is a block diagram showing a configuration of an image sensor according to embodiments.

FIG. 15 is a block diagram showing a configuration of an image sensor according to embodiments.

Referring to FIG. 15, an image sensor 1500 may include a pixel array 1510, a controller 1530, a row driver 1520, and a pixel signal processor 1540.

The image sensor 1500 may include at least one of the image sensor packages 10, 20, and described above. The pixel array 1510 may include a plurality of unit pixels that are 2-dimensionally arranged, and each unit pixel may include a photoelectric conversion element. The photoelectric conversion element may absorb light to generate photocharges and an electric signal (output voltage) based on generated photocharges may be provided to the pixel signal processor 1540 through a vertical signal line.

Unit pixels included in the pixel array 1510 may provide one output voltage at a time row-by-row, and thus, unit pixels of one row of the pixel array 1510 may be simultaneously activated by a selection signal output by the row driver 1520. Unit pixels of a selected row may provide an output voltage according to absorbed light to an output line of a corresponding column.

The controller 1530 may control the row driver 1520, such that the pixel array 1510 absorbs light and accumulates photocharges or temporarily stores accumulated photocharges and outputs electric signals according to stored charges beyond the pixel array 1510. Also, the controller 1530 may control the pixel signal processor 1540 to measure an output voltage provided by the pixel array 1510.

The pixel signal processor 1540 may include a correlation double sampler (CDS) 1542, an analog-digital converter (ADC) 1544, and a buffer 1546. The CDS 1542 may sample and hold an output voltage provided by the pixel array 1510.

The CDS 1542 may double sample a particular noise level and a level according to a generated output voltage and output a level corresponding to a difference therebetween. Also, the CDS 1542 may receive ramp signals generated by a ramp signal generator 1548, compare them with each other, and output a result of the comparison.

The ADC 1544 may convert an analog signal corresponding to a level received from the CDS 1542 into a digital signal. The buffer 1546 may latch digital signals, and latched signals may be sequentially output to beyond the image sensor 1500 and transmitted to an image processor.

While the inventive concept has been particularly shown and described with reference to embodiments thereof, it will be understood that various changes in form and details may be made therein without departing from the spirit and scope of the present disclosure.

What is claimed is:

1. An image sensor package, comprising:
- a package substrate;
- a logic chip mounted on the package substrate and including a central region and an edge region;
- an image sensor chip mounted on the central region of the logic chip;
- a bonding wire electrically interconnecting the package substrate to the logic chip, the bonding wire bonded to the edge region of the logic chip;
- a dam structure disposed in the edge region of the logic chip and covering a portion of the bonding wire;
- a cover glass disposed on the dam structure; and
- an encapsulation structure encapsulating the bonding wire on the package substrate,
- wherein the encapsulation structure and the image sensor chip is separated by the dam structure.

2. The image sensor package of claim 1, wherein, a first area of the logic chip is larger than a second area of the image sensor chip.

3. The image sensor package of claim 2, wherein, a third area defined by the dam structure is smaller than the first area of the logic chip, and
- wherein the third area of the dam structure is larger than the second area of the image sensor chip.

4. The image sensor package of claim 3, wherein, a fourth area of the cover glass is larger than the second area of the image sensor chip.

5. The image sensor package of claim 1, wherein the encapsulation structure contacts outer walls of the logic chip, outer walls of the dam structure, and outer walls of the cover glass.

6. The image sensor package of claim 5, wherein the encapsulation structure does not contact the image sensor chip.

7. The image sensor package of claim 1, wherein a connection pad is disposed on the edge region of the logic chip,
- wherein the bonding wire is bonded to the connection pad, and
- wherein the dam structure covers the connection pad.

8. The image sensor package of claim 7, wherein the logic chip and the image sensor chip are electrically connected to each other by a solder ball disposed therebetween.

9. The image sensor package of claim 1, wherein the dam structure and the image sensor chip are spaced apart from each other,
- wherein sidewalls of the dam structure face sidewalls of the image sensor chip, and
- wherein a vertical level of a top surface of the dam structure is higher than a vertical level of a top surface of the image sensor chip.

10. The image sensor package of claim 9, wherein the dam structure comprises glass attach glue.

* * * * *